United States Patent [19]
Nishima et al.

[11] Patent Number: 5,471,246
[45] Date of Patent: Nov. 28, 1995

[54] APPARATUS FOR DETERMINING CHARGE/VOLTAGE CONVERSION RATIOS IN CHARGE COUPLED DEVICES

[75] Inventors: Osamu Nishima; Tomoyuki Suzuki; Kazuhiko Nishibori, all of Kanagawa, Japan

[73] Assignee: Sony Corporation, Tokyo, Japan

[21] Appl. No.: 232,421

[22] Filed: Apr. 21, 1994

Related U.S. Application Data

[62] Division of Ser. No. 48,953, Apr. 16, 1993, abandoned, which is a continuation of Ser. No. 766,504, Sep. 27, 1991, abandoned.

[30] Foreign Application Priority Data

Sep. 27, 1990 [JP] Japan ................................ 2-258515

[51] Int. Cl.$^6$ ..................................................... H04N 5/335
[52] U.S. Cl. .......................... 348/322; 348/296; 348/298; 348/311; 327/534; 257/231
[58] Field of Search ...................................... 348/296, 297, 348/298, 311, 312, 313, 314, 316, 322; H04N 5/335

[56] References Cited

U.S. PATENT DOCUMENTS

| | | | |
|---|---|---|---|
| 4,241,262 | 12/1980 | Audaire et al. | 307/221 |
| 4,672,455 | 6/1987 | Miyatake | 358/213.31 |
| 4,680,489 | 7/1987 | Stetson | 307/493 |
| 4,811,371 | 3/1989 | Tower | 377/60 |
| 4,875,100 | 10/1989 | Yonemoto | 358/213.19 |
| 4,912,560 | 3/1990 | Osawa | 358/213.31 |
| 4,963,983 | 10/1990 | Kohno | 358/213.31 |
| 5,012,344 | 4/1991 | Goto | 358/213.11 |
| 5,029,190 | 7/1991 | Narabu et al. | 377/60 |
| 5,068,736 | 11/1991 | Hamasaki | 358/213.13 |
| 5,136,389 | 8/1992 | Suzuki | 358/213.31 |

OTHER PUBLICATIONS

Applicant's Submitted Prior Art (FIG. 1).

Primary Examiner—Michael T. Razavi
Assistant Examiner—Ngoc-Yen Vu
Attorney, Agent, or Firm—Hill, Steadman & Simpson

[57] ABSTRACT

A method for determining a charge/voltage conversion ratio of a solid state image pickup element with an electronic shutter function which is capable of transferring signal charge accumulated in a photosensitive portion to a substrate. A voltage of a predetermined first level is applied to the substrate to measure an output voltage at an output portion, and then a voltage of a second level higher than that of the first level is applied to the substrate to measure a current flowing through the substrate, thereby obtaining a charge/voltage conversion ratio in accordance with a ratio between the measured output voltage and the measured current.

1 Claim, 4 Drawing Sheets

APPARATUS FOR DETERMINING CHARGE/VOLTAGE CONVERSION RATIOS IN CHARGE COUPLED DEVICES

This is a division, of application Ser. No. 08/048,953, filed Apr. 16, 1993 now abandoned which is a continuation of Ser. No. 07/766,504 filed Sep. 27, 1991, now abandoned.

BACKGROUND OF THE INVENTION

1. Field of the Invention

The present invention relates to a method for measuring a charge/voltage conversion ratio of a solid state image pickup element with an electronic shutter function.

2. Description of the Prior Art

In a solid state image pickup element, a charge/voltage conversion ratio can be obtained from a ratio between a current value and a voltage value since a charge value can be represented as a current value in case of taking a time factor into consideration. Now, the charge/voltage conversion ratio represents an efficiency in case of converting transfer charges into a voltage at an output portion of the solid state image pickup element.

It has been proposed in the art to provide such a measuring method for the conversion ratio that, in a circuit arrangement of an output portion of the solid state image pickup element, e.g., a charge-coupled device (CCD) image pickup element shown in FIG. 1, a current $I_{RD}$ flowing through a reset drain (RD) terminal 42 of a gate circuit 40 is measured when a positive pulse $\phi_R$ is applied to a reset gate (RG) terminal 41 of the gate circuit 40 constituted by a MOS FET which constitutes a floating diffusion amplifier (FDA), then a change in signal charges being stored in a diode 43 in an off state of the gate 40 is detected as a change in a voltage by an amplifier 44 constructed by two stages of source follower circuits to thereby measure an output voltage $V_{OUT}$ applied to an output terminal 45, and further a charge/voltage conversion ratio η is obtained based on the thus measured current $I_{RD}$ and voltage $V_{OUT}$ in accordance with a following formula $$\eta = (V_{OUT}/I_{RD}) \times K1$$

where K1 is a coefficient.

According to this measuring method, a dedicated terminal for the measurement is not required to be provided independently, and the measurement is performed while operating the CCD image pickup element in a normal operation mode, so that the measurement can be performed while the CCD image pickup element being in both a wafer state and an assembled state.

However, in the above-mentioned conventional measuring method, since the current $I_{RD}$ flowing through the RD terminal 42 is intermittently interrupted by the high-frequency pulse $\phi_R$ to be a current similar to an AC current, the measurement is required to measure an integrated current value obtained by smoothing the current $I_{RD}$ similar to the AC current, so that a value measured by a measuring unit such as an ampere meter is likely to include an error. In particular, since the integrated current is such a small current of about several nA, then a leakage current in the measuring unit likely influences a measured value to thereby increase a measuring error. Further, a reproduced image may be disturbed by connecting the ampere meter to the RD terminal 42.

In recent years, a small-sized image pickup element is decreased in its number of terminals in order to miniaturize a chip such that the RD terminal 42 is also used as a power source terminal 46 to which a power supply voltage $V_{DD}$ same as the voltage $V_{RD}$ is applied to thereby decrease the number of terminals. The conventional measuring method can not be applied to such an image pickup element wherein the RD terminal 42 is also used as the power source terminal 46 since the conventional measuring method requires that the RD terminal 42 is independently provided.

OBJECTS AND SUMMARY OF THE INVENTION

Accordingly, it is a general object of the present invention to provide an improved method for measuring a charge/voltage conversion ratio.

More specifically, it is an object of the present invention to provide an improved method for measuring a charge/voltage conversion ratio which is capable of measuring the conversion ratio at a remarkably improved high accuracy and applicable to an image pickup element where a RD terminal is not provided independently.

According to an aspect of the present invention, a method for measuring a charge/voltage conversion ratio of a solid state image pickup element with an electronic shutter function which is capable of transferring signal charge accumulated in a photosensitive portion to a substrate, comprising the steps of applying a voltage of a predetermined first level to the substrate and measuring an output voltage at an output portion, applying a voltage of a second level larger than that of the first level to the substrate and measuring a current flowing through the substrate, and obtaining a charge/voltage conversion ratio in accordance with a ratio between the measured output voltage and the measured current.

The above and other objects, features, and advantages of the present invention will become apparent from the following detailed description of an illustrative embodiment thereof to be read in conjunction with the accompanying drawings.

DETAILED DESCRIPTION OF THE PREFERRED EMBODIMENT

Figure 1:
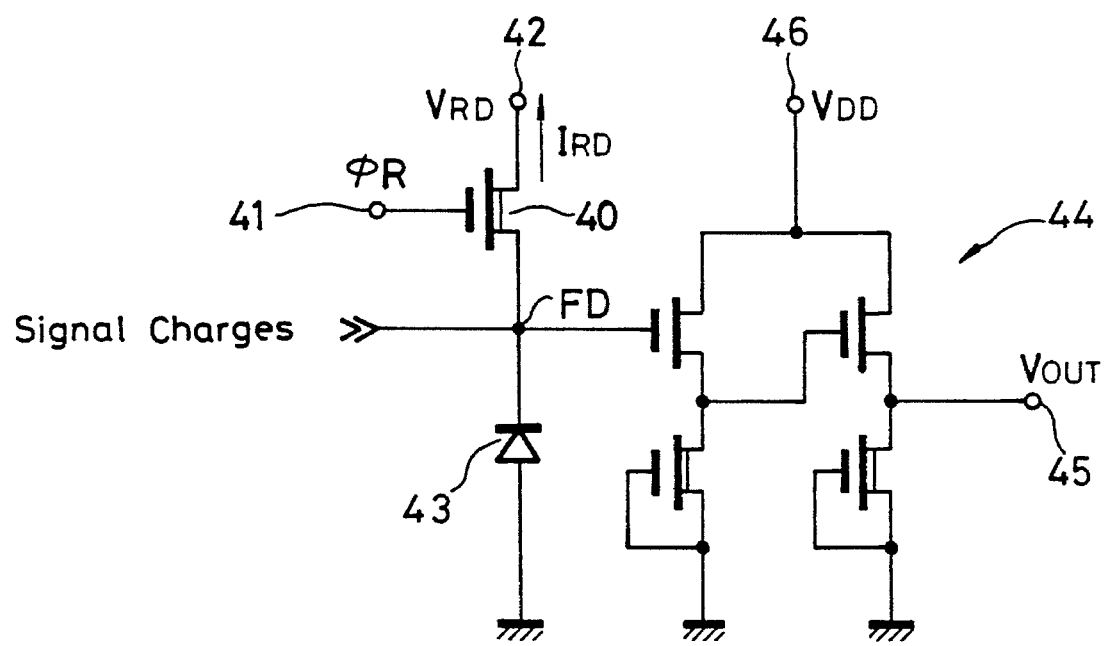
FIG. 1 is a circuit diagram illustrating an example of an output portion of a CCD image pickup element.

A preferred embodiment of the present invention will now be described with reference to the accompanying drawings, wherein like reference numerals denote like or corresponding elements throughout the drawings.

Figure 2:
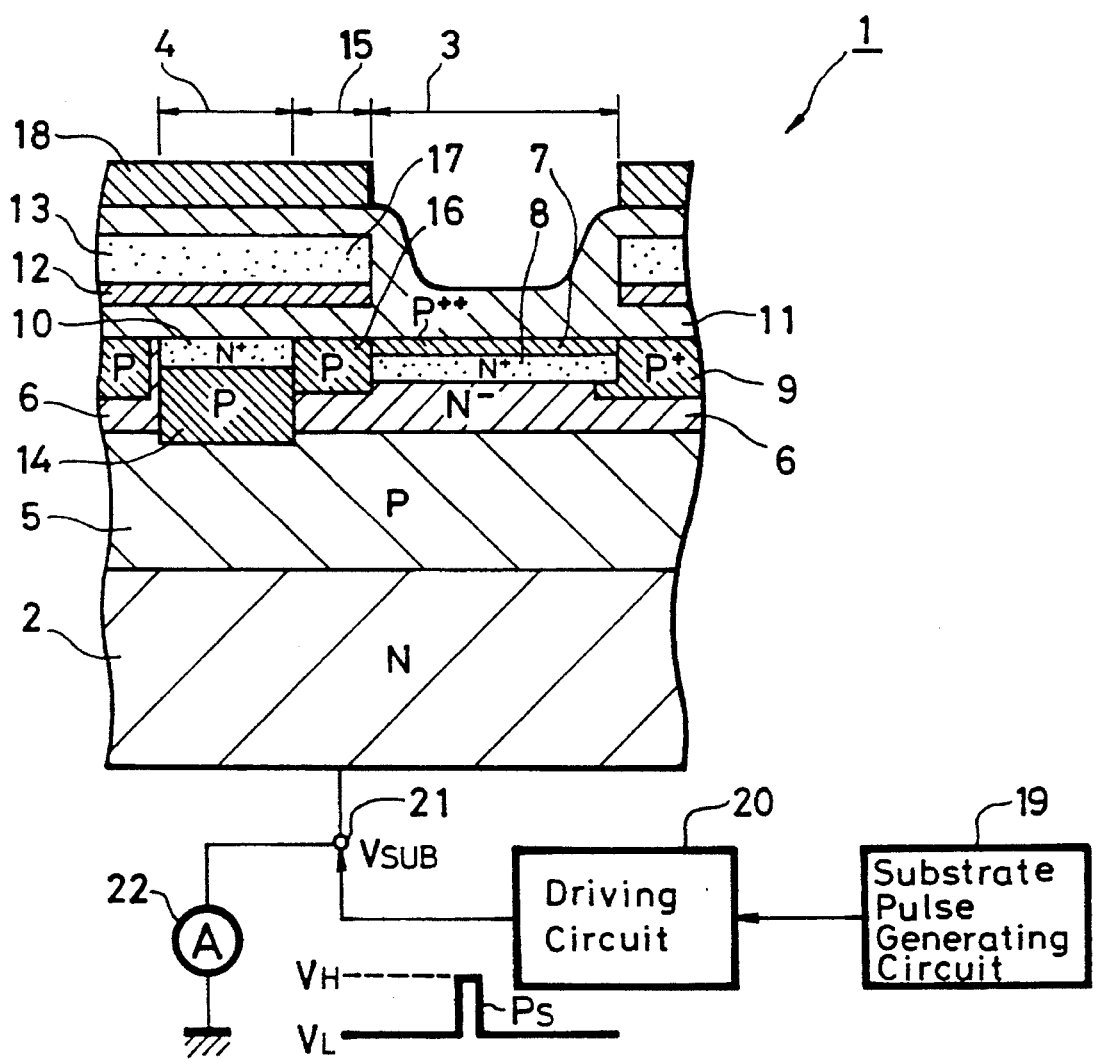
FIG. 2 is a sectional view of a CCD image pickup element to which a method for measuring charge/voltage conversion ratio according to the present invention is applied and illustrates constructions of a driving system of the CCD image pickup element.

Referring now to FIG. 2, which is a sectional view of a solid state image pickup element, for example, a CCD image pickup element 1 to which a method for measuring charge/voltage conversion ratio according to the present invention is applied and illustrates constructions of a driving system of the CCD image pickup element 1, the CCD image pickup element 1 is of a so-called inter-line transfer type which is constructed by providing a photosensitive portion 3, a vertical shift register portion 4, horizontal shift register portion (not shown) and an output portion (not shown) on an N-type silicon substrate 2.

In the CCD image pickup element 1, a P-type region 5 is formed on a major surface side of the N-type silicon substrate 2 and then an N⁻-type region 6 is formed on a major surface side of the P-type region 5. The photosensitive portion 3 is constituted by forming a thin P⁺⁺-type region 7 on a major surface side of the N⁻-type region 6 and further an N⁺-type region 8 constituting a signal charge accumulating or storage region beneath the P⁺⁺-type region 7. A P⁺-type region 9 constituting a channel stop portion is formed adjacent to the P⁺⁺-type region 7 and the N⁺-type region 8.

The vertical shift register portion 4 is constituted by an N⁺-type region 10 constituting a signal charge transfer region and a transfer electrode 13 made of a polycrystalline silicon formed on the N⁺-type region 10 through a $SiO_2$ insulation layer 11 and a $Si_3N_4$ insulation layer 12. In this case, a P-type region 14 for preventing a smear is formed beneath the N⁺-type region 10 constituting the signal charge transfer region. A read-out gate portion 15 for reading the signal charge in the photosensitive portion 3 and transferring it to the vertical shift register portion 4 is formed between these portions 3 and 4. The read-out gate portion 15 is formed by forming a gate electrode 17 on a P-type region 16 constituting a channel region through the insulation layers 11 and 12. In this embodiment, the gate electrode 17 and the transfer electrode 13 are commonly made of polycrystalline silicon.

An aluminum layer 18 for shielding light is formed through the insulation layer 11 on the read-out gate portion 15, the vertical shift register portion 4 and the channel stop portion 9, except for the photosensitive portion 3. FIG. 2 shows only one transfer electrode 13 for simplifying the drawings, but in this embodiment a plurality of transfer electrodes are disposed so as to drive the vertical shift register portion 4 by a known four-phase driving system.

Explanation will be made about a measuring method according to the present invention for measuring a charge/voltage conversion ratio (hereinafter referred to a conversion ratio) η of the thus constructed CCD image pickup element 1.

Figure 3:
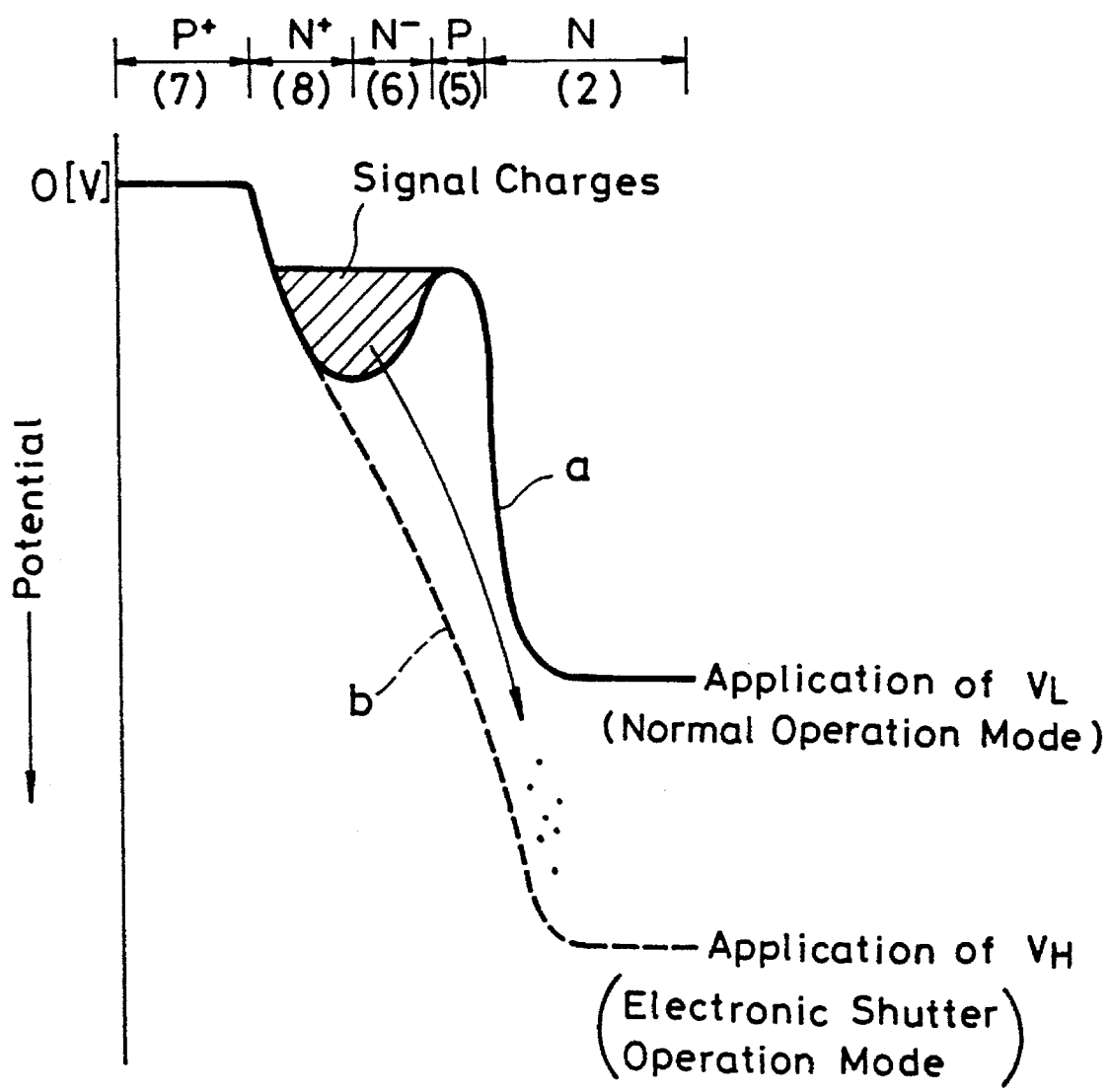
FIG. 3 is a diagram illustrating potential distribution of a photosensitive portion of the CCD image pickup element to the vertical direction thereof.

In order to measure the conversion ratio η, there are provided with a a substrate pulse generating circuit 19 for generating a substrate pulse Ps to be applied to the N-type silicon substrate 2 and a driving circuit 20 for applying the substrate pulse Ps outputted from the substrate pulse generating circuit 19 to the substrate 2 through a substrate terminal 21. A low level (first level) $V_L$ of the substrate pulse Ps is set to be such a voltage as shown by a steady line a in FIG. 3 that a potential at the P-type region 5 is shallower than that of the signal charge accumulation region 8 and capable of accumulating the signal charge in the signal charge accumulating region 8, e.g., about +12 v. A high level (second level) $V_H$ of the substrate pulse Ps is set to be such a voltage as shown by a dotted line b in FIG. 3 that a potential at the P-type region 5 is deeper than that of the signal charge accumulation region 8 and capable of transferring the signal charge accumulated in this region 8 to the N-type silicon substrate 2, e.g., about +27 V.

Am ampere meter 22 is connected to the substrate terminal 21 in order to measure a substrate current $I_{SUB}$ flowing into the N-type silicon substrate 2 which is generated by such an operation referred to an electrical shutter operation that the signal charge accumulated in the signal charge accumulation region 8 is transferred to the N-type silicon substrate 2 in response to the substrate pulse Ps of the high level $V_H$ applied to the substrate 2.

Figure 4:
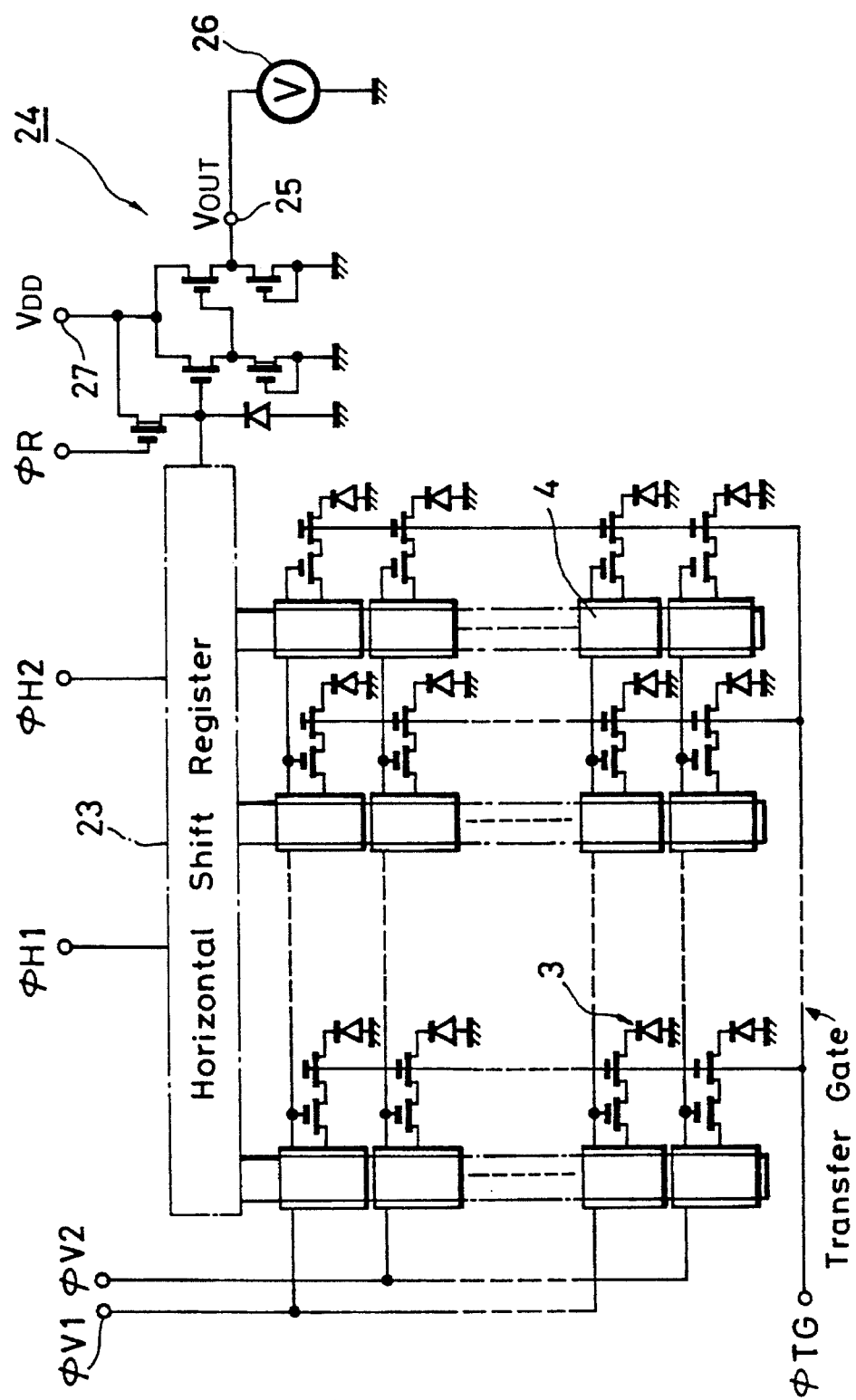
FIG. 4 is a diagram illustrating constitutions of a CCD image pickup element of an inter-line transfer type.

Referring to FIG. 4 illustrating the constructions of the CCD image pickup element 1, a voltmeter 26 is connected to an output terminal 25 of an output portion 24 which is provided at the last stage of a horizontal shift register portion 23. The voltmeter 26 measures an output voltage $V_{OUT}$ in a normal operation mode when the substrate pulse Ps of the low level $V_L$ is applied to the N-type silicon substrate 2.

Procedures for measuring the conversion ratio η will be explained hereinafter.

At first, the substrate pulse Ps of the low level $V_L$ is applied to the N-type silicon substrate 2, then an output voltage $V_{OUT}$ of the output portion 24 is measured by the voltmeter 26 at the output terminal 25 (a first procedure). Secondary, the substrate pulse Ps at the high level $V_H$ is applied to the N-type silicon substrate 2 at a predetermined timing, then a potential barrier provided at the P-type region 5 by the application of the high level voltage $V_H$ is destroyed as shown by the dotted line b in FIG. 3, so that the signal charge (unnecessary charge) accumulated in the photosensitive portion 3 (the signal charge accumulation region 8) is transferred to the N-type silicon substrate 2. The substrate current $I_{SUB}$ flowing into the substrate 2 due to this phenomenon is measured by the ampere meter 22 at the substrate terminal 21 (a second procedure). Lastly, a conversion ratio η is obtained on the basis of thus measured substrate current $I_{SUB}$ and output voltage $V_{OUT}$ in accordance with a following formula (a third procedure)

$$\eta = (V_{OUT}/I_{SUB}) \times K_2$$

where $K_2$ is a coefficient.

Thus, in the CCD image pickup element 1 with an electronic shutter function according to this embodiment, the substrate current $I_{SUB}$ flowing into the N-type substrate 2 in the electronic shutter operation mode is measured, then the thus measured substrate current $I_{SUB}$ which is a continuous current similar to a DC current is used as one parameter for calculating the conversion ratio η, so that an accuracy of a measured value of the conversion ratio η can be improved remarkably when compared with the conventional measuring method described above wherein the integrated current value of the current $I_{RD}$ which is similar to the AC current is used as one parameter for measuring the conversion ratio.

The measuring method according to the present invention measures the substrate current $I_{SUB}$ by using the substrate terminal ($V_{SUB}$) 21 which is provided in the conventional CCD image pickup element, so that the present invention can be applied to such a CCD image pickup element 1 that a reset drain (RD) terminal is not provided independently so as to decrease the number of terminals by using the RD terminal also as a power source terminal ($V_{DD}$) 27, as shown in FIG. 4.

In the above-described embodiment, the measured substrate current $I_{SUB}$ is directly used as a parameter for calculating the conversion ratio η, but such a substrate current $I_{1SUB}$ may be used as a parameter for calculating the conversion ratio η instead of the current $I_{SUB}$ that is obtained by subtracting a substrate current $I_{0SUB}$ measured in the normal operation mode in response to the application of the substrate pulse Ps of the low level voltage $V_L$ to the N-type silicon substrate 2 from the substrate current $I_{SUB}$ measured in the electrical shutter operation mode. In this case, since the substrate current $I_{oSUB}$ is a current component due to a PN junction other than the photosensitive portion 3, the substrate current $I_{1SUB}$ is obtained by subtracting the current component $I_{oSUB}$ due to the PN junction other than the photosensitive portion 3 from the substrate current $I_{SUB}$ measured in the electrical shutter operation mode, so that an accurate substrate current can be measured, resulting in improving of the measuring accuracy of the conversion ratio η.

As described above, according to the present invention, in a solid state image pickup element with an electrical shutter function, an output voltage at the output portion thereof in the normal operation mode and a substrate current at the electronic shutter operation mode are respectively measured, then a conversion ratio η is obtained by using these measured values as parameters for calculating the conversion ratio, so that an accuracy of the measured value of the conversion ratio can be improved remarkably and further the present invention can be applied to such a solid state image pickup element that does not have a reset drain (RD) terminal independently.

Having described preferred embodiment of the invention with reference to the accompanying drawings, it is to be understood that the invention is not limited to the precise embodiment and that various changes and modifications could be effected by one skilled in the art without departing from the spirit or scope of the novel concepts of the invention as defined in the appended claims.

We claim as our invention:

1. A solid state image pickup apparatus for use in determining a charge/voltage conversion ratio comprising:

a semiconductor substrate having a first conductivity type;

a photosensitive portion formed on said semiconductor substrate, and consisting of a first semiconductor layer having a second conductivity type and formed on said substrate, a storage region of the first conductivity type formed on the first semiconductor layer, the photosensitive portion being capable of transferring signal charges accumulated in said storage region to the substrate through said first semiconductor layer;

a vertical shift register formed on said first semiconductor layer;

a horizontal shift register coupled to one end of said vertical shift register;

an output terminal connected to a last stage of said horizontal shift register;

a substrate pulse generating circuit generating a first level pulse which causes a first potential at the first semiconductor layer which is less than the potential of the storage region; and a second level pulse which causes a second potential at the first semiconductor layer which is greater than the potential of the storage region;

a substrate terminal connected to said substrate and receiving the outputs of said pulse generating circuit;

a first detecting means connected to said substrate terminal so as to measure a substrate current flowing through said substrate terminal when said first level pulse is supplied to said substrate terminal; and a second detecting means connected to said output terminal so as to measure an output voltage of said output terminal wherein the charge/voltage conversion ratio is obtained in accordance with a ration between the output voltage and the substrate current.

* * * * *